(12) United States Patent
La Placa et al.

(10) Patent No.: US 11,107,525 B2
(45) Date of Patent: Aug. 31, 2021

(54) PHASE CHANGE MEMORY WITH SUPPLY VOLTAGE REGULATION CIRCUIT

(71) Applicant: STMicroelectronics S.r.l., Agrate Brianza (IT)

(72) Inventors: Michele La Placa, Cefalu' (IT); Fabio Enrico Carlo Disegni, Spino d'adda (IT); Federico Goller, Turin (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 16/924,760

(22) Filed: Jul. 9, 2020

(65) Prior Publication Data

US 2021/0012836 A1 Jan. 14, 2021

(30) Foreign Application Priority Data

Jul. 11, 2019 (IT) .................. 102019000011523

(51) Int. Cl.
*G11C 11/00* (2006.01)
*G11C 13/00* (2006.01)
*H01L 45/00* (2006.01)

(52) U.S. Cl.
CPC ...... *G11C 13/0004* (2013.01); *G11C 13/0026* (2013.01); *G11C 13/0028* (2013.01); *G11C 13/0038* (2013.01); *G11C 13/0069* (2013.01); *G11C 13/0097* (2013.01); *H01L 45/06* (2013.01)

(58) Field of Classification Search
CPC ........... G11C 13/0004; G11C 13/0026; G11C 13/0028; G11C 13/0038
See application file for complete search history.

(56) References Cited

U.S. PATENT DOCUMENTS

| | | |
|---|---|---|
| 2010/0149861 A1 | 6/2010 | Park |
| 2013/0229863 A1 | 9/2013 | Conte et al. |
| 2015/0212530 A1* | 7/2015 | Forejtek ............... G05F 1/56 323/280 |
| 2017/0047919 A1* | 2/2017 | Sandhu ............... H01L 49/003 |
| 2019/0096480 A1 | 3/2019 | Conte |
| 2019/0140175 A1 | 5/2019 | Hinsinger |
| 2019/0140176 A1 | 5/2019 | Arnaud et al. |
| 2019/0146532 A1* | 5/2019 | Ballarin ............... H05B 45/20 323/283 |

* cited by examiner

*Primary Examiner* — Vu A Le
(74) *Attorney, Agent, or Firm* — Slater Matsil, LLP

(57) ABSTRACT

A voltage regulator and a phase change memory are disclosed. In an embodiment a phase-change memory includes an array of a plurality of phase-change memory cells, an address decoder configured for receiving an address signal and selecting a sub-area in the array of the plurality of memory cells, the selected sub-area having a given number of bits of a data signal and a writing circuit including a control circuit configured for receiving the data signal and determining, for each memory cell in the selected sub-area, whether a respective bit of the data signal indicates that the memory cell is to be changed from the amorphous state to the polycrystalline state and one or more driving circuits supplied via a regulated voltage and configured for applying the set current for the first interval to the memory cells that are to be changed from the amorphous state to the polycrystalline state.

19 Claims, 10 Drawing Sheets

FIG. 12

PHASE CHANGE MEMORY WITH SUPPLY VOLTAGE REGULATION CIRCUIT

CROSS-REFERENCE TO RELATED APPLICATIONS

This application claims priority to Italian Patent Application No. 102019000011523, filed on Jul. 11, 2019, which application is hereby incorporated herein by reference.

TECHNICAL FIELD

Embodiments of the present disclosure refer to circuits for regulating the supply voltage of writing circuits for writing cells of a phase-change memory.

BACKGROUND

FIG. 1 shows a diagram of a phase-change memory (PCM) 20 that comprises a memory area 200 that includes a plurality of memory cells CELL. For instance, frequently the memory cells CELL are arranged in a plurality of columns and, optionally, rows.

In particular, in phase-change memories, each memory cell CELL is based upon the use of alloys, for example chalcogenide alloys, e.g., $Ge_xSb_yT_z$ (more briefly referred to a GST alloys), which, following upon appropriate thermal treatments pass in a reversible way from an amorphous state with low electrical conductivity into a polycrystalline state with high conductivity. For instance, in this context, the US patent applications Nos. US 2019/096480 A1, US 2019/140175 A1 or US 2019/140176 A1 may be cited, the contents of which are thus incorporated herein for reference.

Typically, the memory 20 receives at input an address signal ADR, where the address signal ADR is used for selecting a given memory sub-area within the memory area 200. The memory 20 further comprises one or more input terminals and/or output terminals for exchanging a data signal DATA with the memory 20, where the data signal DATA may comprise data to be written DATA_IN and/or data that have been read DATA_OUT.

For instance, the address signal ADR can be supplied to a column decoder 204 (which, in turn, typically supplies a bitline signal BL) and to a row decoder 202 (which, in turn, typically supplies a wordline signal WL) in order to select a given memory sub-area in the memory area 200. Typically, the sub-area selected has a number of bits that corresponds to the number of bits of the data signal DATA, i.e., of the signals DATA_IN and DATA_OUT.

Frequently, the address signal ADR is not directly supplied to the row decoder and the column decoder, but the address signal ADR is typically stored in an address buffer 208. Likewise, also the data signal DATA can be stored in a data buffer 214.

In particular, in the example considered, the memory 20 supports both reading and writing operations, which can be selected through a control signal W/R. For this purpose, the memory area 200 has associated a writing and reading interface 206. For instance, the interface 206 may comprise a writing circuit 212, the so-called "program driver", for writing the data DATA_IN in the memory sub-area selected, and a reading circuit 210, such as a sense amplifier, for reading data DATA_OUT from the memory cell CELL selected.

For instance, with reference to phase-change memories, the (considerable) difference in conductivity between the amorphous state and the polycrystalline state enables association of a binary datum to the state into which the material of a cell CELL is brought, it being possible for this datum to be easily detected, for example by measuring, by means of the measurement/reading circuit 210, a parameter indicating the electrical resistance of the material of the cell CELL.

Hence, in order to write information in a memory cell CELL, the writing circuit 212 should be able to write/program the state (whether amorphous or polycrystalline) of the memory cell.

Specifically, as illustrated in FIG. 2A, to bring a memory cell CELL of the phase-change memory 20 into a first, low-conductivity, state (referred to hereinafter as reset state), the writing circuit 212 should apply to the cell a current $I_{cell}=I_{reset}$ for a brief time interval $\Delta T1$, after which the current $I_{cell}$ is brought sharply to zero. In particular, this current $I_{cell}$ should be high enough to bring the material of the cell CELL to the melting point $T_{melt}$, thus causing melting of the material of the cell CELL. The fast cooling that follows then leaves the material in the amorphous state.

Instead, as shown in FIG. 2B, to bring a memory cell CELL from the first state (reset) to a second, high-conductivity, state (referred to hereinafter as set state), the writing circuit 212 should apply to the cell a current $I_{cell}=I_{set}$, where $I_{set}<I_{Reset}$, for a brief time interval $\Delta T2$, this current being subsequently reduced according to a ramp or in steps during a time interval $\Delta T3$. In particular, this current $I_{cell}=I_{set}$ should be sufficient to reach the crystallisation temperature $T_x$, with $T_x<T_{melt}$. The gradual cooling that is obtained in this case induces formation of crystals and hence the condition of high conductivity.

FIGS. 3A, 3B, and 3C show some examples of implementation of a single memory cell CELL.

In particular, as mentioned previously, the cell CELL of a PCM comprises a memory element made of GST, such as a chalcogenide alloy, connected between a bitline BL and a wordline WL.

For instance, in FIG. 3A, the GST memory element is connected to a field-effect transistor (FET) T1, such as a metal-oxide-semiconductor field-effect transistor (MOSFET), for example of an n-channel type, such as an NMOS transistor, between the bitline BL and a reference voltage, for example ground GND. Moreover, the wordline WL drives the gate terminal of the transistor T1.

Instead, in FIG. 3B, the transistor FET has been replaced with a bipolar-junction transistor T2.

Finally, in FIG. 3C, a diode D is used; i.e., the memory element GST is connected between the lines BL and WL.

Basically, these examples have in common that by applying a given voltage to the wordline WL, a selector/electronic switch (T1, T2, or D) switches on, enabling the passage of a current $I_{cell}$ from the bitline BL selected through the memory element GST.

For instance, FIG. 4 shows an implementation of the memory 20.

In particular, in the example considered a single memory cell CELL is illustrated that is connected between a bitline BLr and a wordline WLq.

As explained previously, the writing circuit 212 should apply to the bitline BLr of the cell CELL a current $I_{cell}$. For this purpose, the writing circuit 212 comprises a driving circuit 2126, i.e., the program driver or drivers, configured for generating a current $I_{cell}$ that is applied by means of a multiplexer 204 to the bitline BLr. In general, also a number of driving circuits 2126 may be used, where each driving circuit 2126 generates a current for a respective cell. For instance, the number of driving circuits 2126 may be equal to the number of bits of the data signal DATA_IN.

In particular, in the example considered, the driving circuit 2126 receives one or more control signals CTRL that set the value of the current $I_{cell}$ supplied by the driving circuit 2126. For instance, using digital control signals, the driving circuit 2126 basically implements a current digital-to-analog converter (IDAC).

In the example considered, the control signals CTRL are supplied by a control circuit 2124 as a function of the (writing/reading) signal W/R and the corresponding data bit DATA_IN<n> to be written.

In particular, typically the writing step is divided into two sub-steps:
- during a first step, all the bits DIN<n> for which a reset of the respective cell CELL is to be carried out are programmed, this enabling supply of a respective current $I_{cell}=I_{reset}$ in the time interval ΔT1 (e.g., W/R="1" and DATA_IN<n>="0"); and
- during a second step, all the bits DIN<n> for which a set of the respective cell CELL is to be carried out are programmed, this enabling supply of a respective current $I_{cell}=I_{set}$ in the time interval (ΔT2+ΔT3) (e.g., W/R="1" and DATA_IN<n>="1").

Consequently, in actual fact, two programming operations are carried out, in which only the current $I_{cell}$ changes. Consequently, the control signal CTRL may comprise a signal DIN that indicates the cells that are to be written. For instance, assuming a signal DATA_IN="0011", the signal DIN can be set to DIN="1100" during the first step and to DIN="0011" during the second step.

In general, the two steps may also be reversed, and the first step is purely optional, for example, when a memory that can be written only once is implemented. Alternatively, the reset step can be carried out also during a separate erasure step, as typically occurs with flash memories.

For instance, FIG. 5 shows an embodiment of the driving circuit 2126. In particular, in the example considered, the driving circuit 2120 comprises two circuits 2120 and 2122.

In particular, the circuit 2122 supplies a signal MAX that indicates the maximum value of the current $I_{cell}$ to be supplied to the cell (for example, the signal MAX is proportional to the current $I_{set}$ or to the current $I_{reset}$ in FIG. 2). In particular, in the example considered, the circuit 2122 is configured for generating the signal MAX as a function of a signal PG_DAC that indicates a gain, preferably a digital signal PG_DAC<i:0> (i.e., with i+1 bits).

Instead, the circuit 2120 receives:
- a signal WRITE_EN that indicates whether a programming/writing operation is to be carried out; i.e., the signal WRITE_EN represents an enabling signal for the circuit 2120;
- a signal DIN that indicates whether the respective selected cell is to be programmed (irrespective of whether it is a set or a reset programming operation);
- the signal MAX that indicates the maximum value of the current to be supplied to the cell to be written (that is, it indicates whether it is a set or a reset programming operation); and
- a signal PART_NUM that indicates the descent ramp.

In particular, in the example considered, the circuit 2120 makes it possible to specify the descent ramp that characterises the set pulse by means of a digital signal PART_CURR<k:0> (i.e., with k+1 bits) that operates by partitioning the current indicated via the signal MAX. Hence, the signal PART_CURR<k:0> makes it possible to specify the time plot of the current $I_{cell}$ injected into the cells to be written.

Consequently, in the embodiment considered, the signals WRITE_EN, DIN, PG_DAC<i:0> and PART_CURR<k:0> represent the control signals CTRL of FIG. 4.

For instance, the circuits 2120 and 2122 can be implemented by means of one or more current mirrors with an appropriate gain.

In general, the driving circuit 2126, and in particular the circuit 2120, requires a supply voltage VPL_REG. The value of this voltage typically depends upon the circuit structure and upon the SOA (safe operating area) of the transistors used. If the external supply voltage Vcc supplied to the memory 20 is too high, so that the absolute maximum values are exceeded, in this case the use of a voltage regulator 2128 becomes necessary to scale down the voltage Vcc within the safety limits (see, for example, FIG. 5).

Represented in FIGS. 6A and 6B are typical structures of generic closed-loop voltage regulators that are able to generate the voltage VPL_REG starting from the voltage Vcc.

In particular, in the examples considered, the regulator comprises a capacitor Ct, where the voltage across the capacitor Ct corresponds to the voltage VPL_REG.

In either case, the capacitor Ct is charged to a given reference voltage through a feedback loop comprising an operational amplifier O1. In particular, for this purpose, the voltage VPL_REG is detected, for example by means of a voltage divider comprising two resistors R1 and R2, and the detected voltage is compared with a reference voltage $V_{BGAP}$, which corresponds, for example, to a voltage of a bandgap type.

In particular, in FIG. 6A, the voltage $V_{BGAP}$ is applied to the negative terminal of the operational amplifier O1, and the voltage detected via the voltage divider R1/R2 is applied to the positive terminal of the amplifier. In this case, the output of the amplifier can hence drive the gate terminal of a p-channel FET M1, which is connected between the voltage Vcc and the capacitor Ct.

Instead, in FIG. 6B, the voltage $V_{BGAP}$ is applied to the positive terminal of the operational amplifier O1, and the voltage detected via the voltage divider R1/R2 is applied to the negative terminal of the amplifier. In this case, the output of the amplifier can hence drive the gate terminal of an n-channel FET M2, which is connected between the voltage Vcc and the capacitor Ct.

These schemes are characterised by a feedback loop with feedback of the output voltage VPL_REG, which includes the output stage. This inclusion typically requires the use of heavy compensations necessary for achieving an adequate frequency stability margin, at the expense of the speed of response. This results in a poor stability of the output voltage in the presence of fast variations of the load current, a fact that renders these regulators incompatible with the characteristics of regulation and of pulsed supply of the current $I_{cell}$ required by PCMs during the writing operations.

SUMMARY

Embodiments provide phase-change memories that comprise innovative circuitry for regulation of the supply voltage of the driving circuits.

Various further embodiments provide a phase-change memory configured for storing a data signal having a given number of bits. In various embodiments, the phase-change memory comprises an array of a plurality of phase-change memory cells, where a memory cell can be brought from an amorphous state with low electrical conductivity into a polycrystalline state with high conductivity by applying a set current for a (first) set interval. In various embodiments, the phase-change memory further comprises an address decoder configured for receiving an address signal and selecting a sub-area in the array, where the sub-area selected has the same number of bits as the data signal.

In various embodiments, the phase-change memory comprises a writing circuit, which includes a control circuit and one or more driving circuits. The control circuit is configured for receiving the data signal and determining, for each memory cell in the selected sub-area, whether a respective bit of the data signal indicates that the memory cell is to be brought from the amorphous state into the polycrystalline state. In various embodiments, the driving circuit or circuits is/are supplied via a regulated voltage and is/are configured for applying the set current to the memory cells that are to be brought from the amorphous state into the polycrystalline state for the set interval.

In various embodiments, the phase-change memory hence also comprises a voltage regulator, which includes a positive input terminal and a negative input terminal for receiving a supply voltage, and a positive output terminal and a negative output terminal for supplying the regulated voltage to the driving circuit or circuits.

In particular, in various embodiments, the voltage regulator comprises a capacitor connected between the positive output terminal and the negative output terminal, an output stage, and a regulation circuit.

In various embodiments, the output stage comprises a plurality of branches, where each branch comprises a voltage generator connected between the positive input terminal and the positive output terminal, where each voltage generator is configured for generating a variable current as a function of a driving signal and the regulated voltage, and where each voltage generator can be selectively activated as a function of a respective enabling signal.

For instance, in various embodiments, each voltage generator comprises a first field-effect transistor and an electronic switch connected in series between the positive input terminal and the positive output terminal, where a gate terminal of the first field-effect transistor is driven via a respective driving signal and where the electronic switch is driven via a respective enabling signal.

In various embodiments, the regulation circuit is configured for generating the driving signals for the voltage generators in such a way as to regulate the voltage between the positive output terminal and the negative output terminal to a required value.

For instance, in various embodiments, a second field-effect transistor and a first current generator are connected in series between the positive input terminal and the negative input terminal, where the second field-effect transistor has the same type of channel as the first field-effect transistor. In this case, a voltage divider can supply a voltage proportional to the voltage on the first current generator, and an operational amplifier can generate the driving signals as a function of the proportional voltage. In particular, in various embodiments, a first input terminal of the operational amplifier is connected to a reference voltage, a second input terminal of the operational amplifier is connected to the voltage supplied by the voltage divider, and the output terminal of the operational amplifier is connected to the gate terminals of the first field-effect transistors and to the gate terminal of the second field-effect transistor.

In various embodiments, the regulation circuit further comprises a third field-effect transistor and a second current generator connected in series between the positive input terminal and the negative input terminal, where the third field-effect transistor has the same type of channel as the first field-effect transistor, where the second current generator is configured for supplying a current that corresponds to the current supplied by the first current generator, where the output terminal of the operational amplifier is connected to a gate terminal of the third field-effect transistor, and where an intermediate point between the third field-effect transistor and the second current generator is connected to the positive output terminal.

In various embodiments, the control circuit can hence generate the enabling signals as a function of the expected current absorption, thus reducing the time of response of the voltage regulator in regard to variations of the load. For instance, the control circuit can determine the number of memory cells that are to be brought from the amorphous state into the polycrystalline state and generate the enabling signals as a function of this number. For instance, in general, the number of branches of the output stage corresponds to a predetermined coefficient multiplied by the number of bits of the data signal.

In this case, the control circuit can generate the enabling signals in such a way that a first number of voltage generators is activated during the set interval, where the first number is determined as a function of the predetermined coefficient and the number of the memory cells that are to be brought from the amorphous state into the polycrystalline state. For instance, the first number may correspond to the predetermined coefficient multiplied by the number of the memory cells that are to be brought from the amorphous state into the polycrystalline state (where the result is an integer obtained by rounding, e.g. either up or down).

In various embodiments, the driving circuit or circuits is/are configured for applying to the memory cells that are to be brought from the amorphous state into the polycrystalline state a current that decreases from the set current to zero as a function of a partitioning signal, for a subsequent second interval. In this case, the control circuit can generate the enabling signals in such a way that a variable second number of voltage generators is activated during the second interval, where the variable second number is determined as a function of the first number and the partitioning signal.

BRIEF DESCRIPTION OF THE DRAWINGS

The embodiments of the present disclosure will now be described with reference to the annexed drawings, which are provided purely by way of non-limiting example and in which:

FIG. 12 shows an example of the control signals for the voltage regulator of FIG. 10.

DETAILED DESCRIPTION OF ILLUSTRATIVE EMBODIMENTS

In the ensuing description, various specific details are illustrated aimed at providing an in-depth understanding of the embodiments. The embodiments may be obtained without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment", and the like, that may be present in various points of this description do not necessarily refer to one and the same embodiment. Moreover, particular conformations, structures, or characteristics may be combined in any adequate way in one or more embodiments.

The references used herein are provided only for convenience and hence do not define the sphere of protection or the scope of the embodiments.

In FIGS. 7 to 12 described hereinafter, parts, elements, or components that have already been described with reference to FIGS. 1 to 6 are designated by the same references previously used in these figures. The description of these elements presented previously will not be repeated in what follows in order not to overburden the present detailed description.

Figure 7:
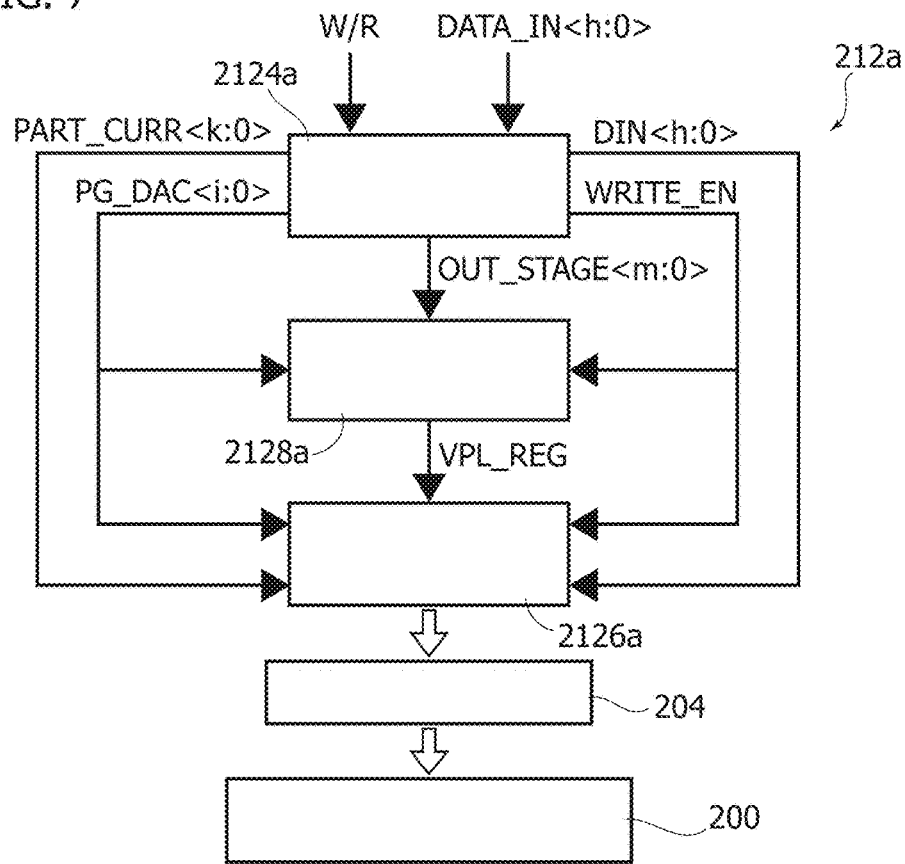
FIG. 7 shows an embodiment of a writing interface of a phase-change memory.

FIG. 7 shows a first embodiment of the writing circuit 212a of a phase-change memory according to the present description.

Also in this case, the writing circuit 212a comprises a control circuit 2124a, a voltage regulator 2128a, and a driving circuit 2126a.

Figure 1:
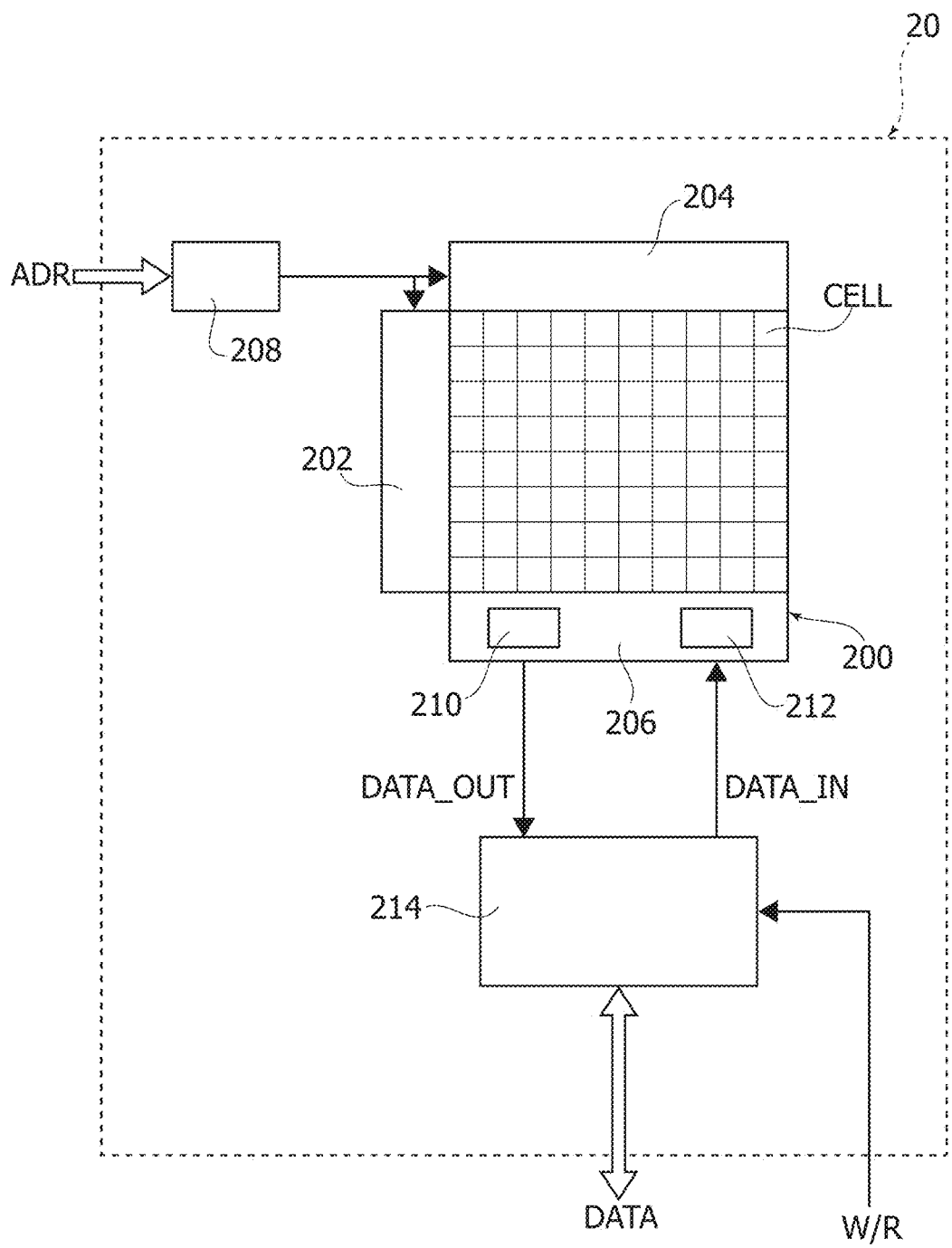
FIG. 1 shows an example of a memory comprising a plurality of phase-change memory cells.
Figure 2A:
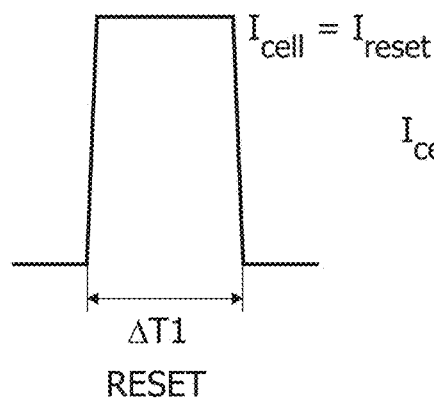
FIGS. 2A and 2B show examples for carrying out a reset and a set of a memory cell.
Figure 2B:
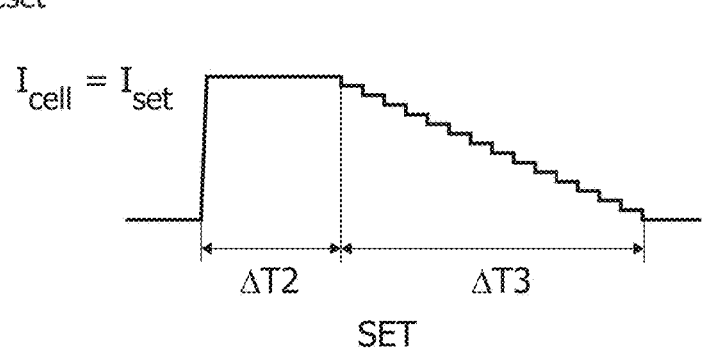
Figure 3A:
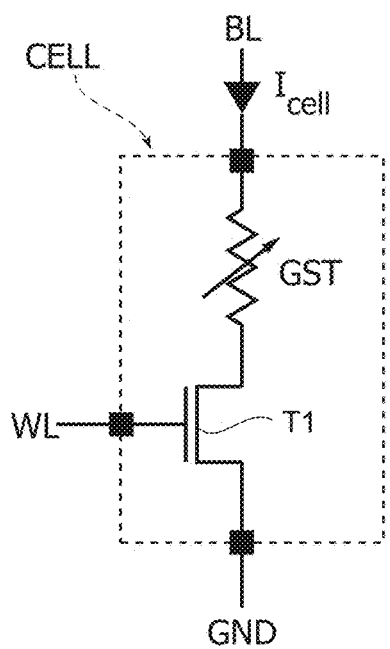
FIGS. 3A, 3B, and 3C show examples of phase-change memory cells.
Figure 3B:
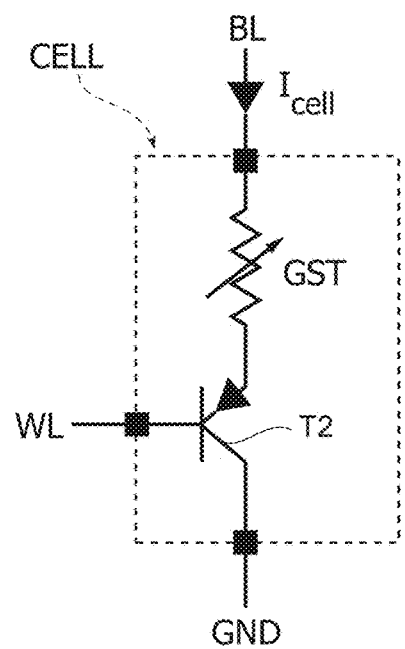
Figure 3C:
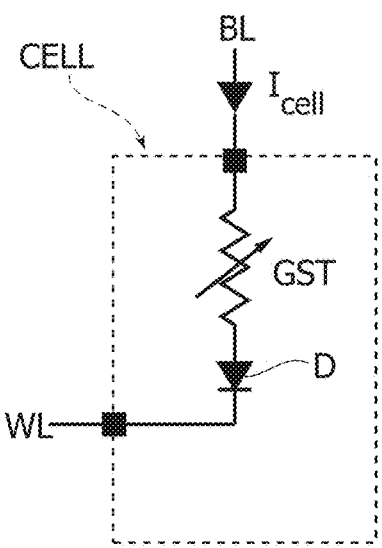
Figure 4:
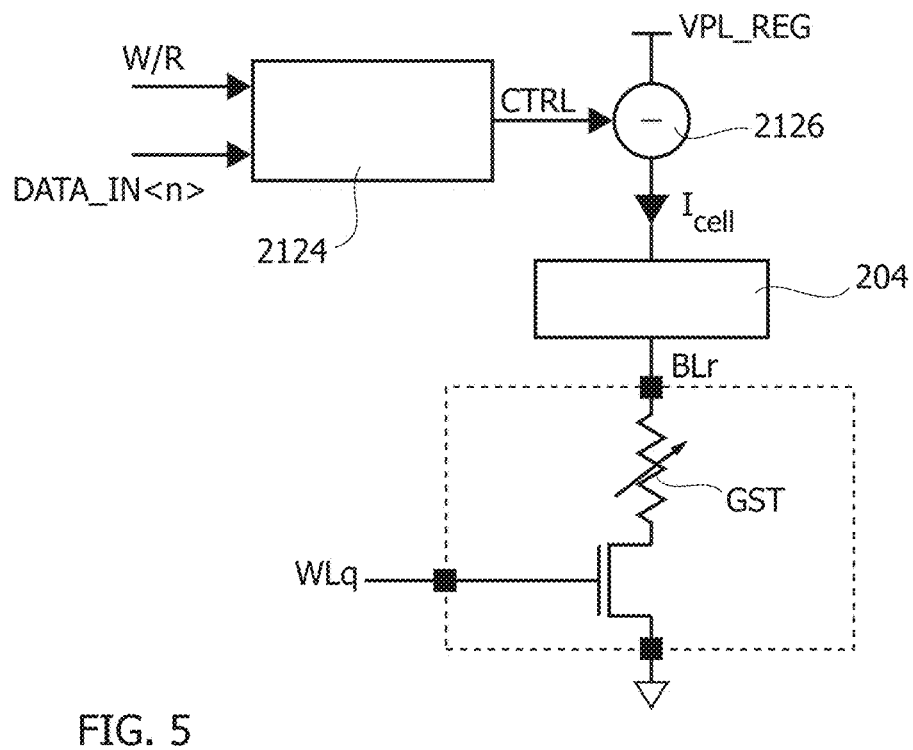
FIG. 4 shows a first example of a writing interface of the memory of FIG. 1.
Figure 5:
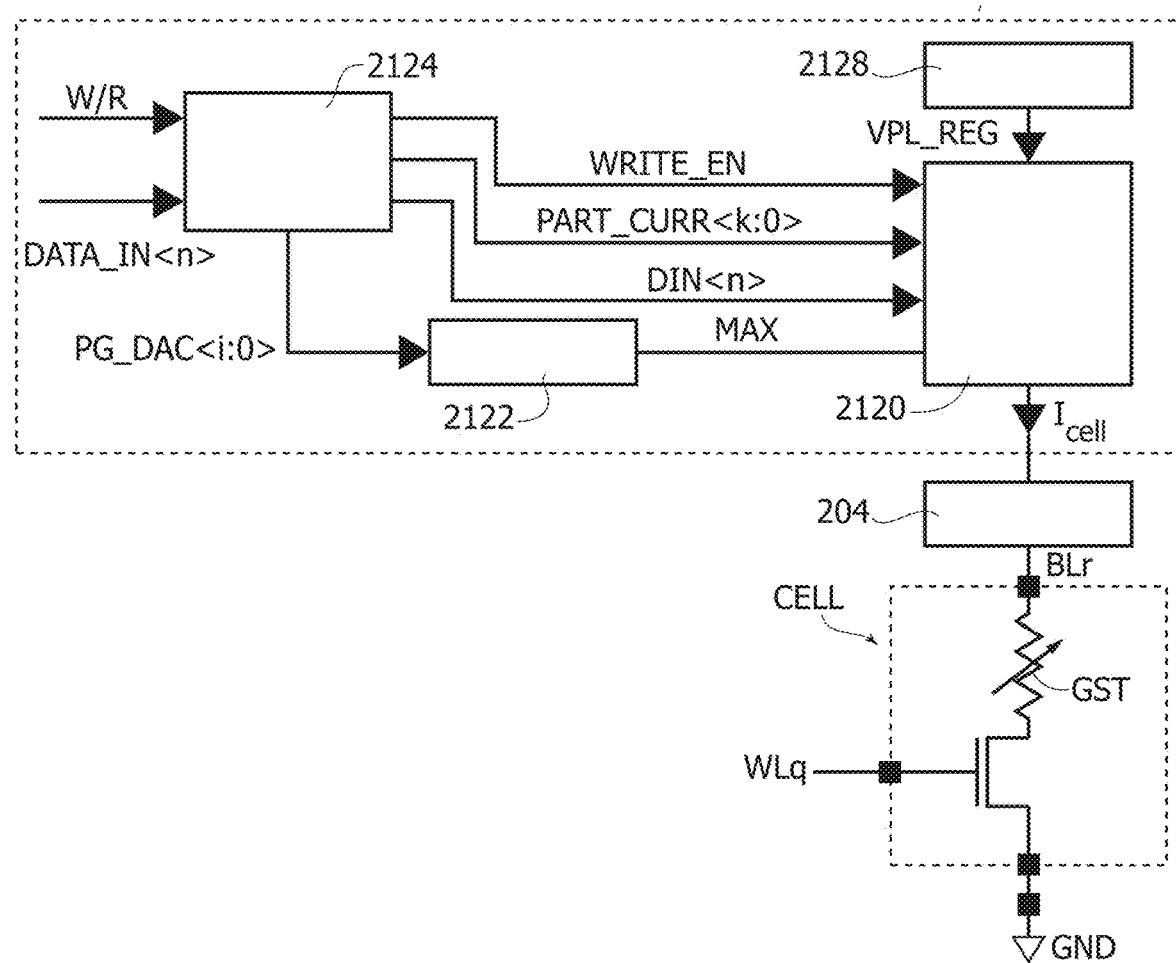
FIG. 5 shows a second example of a writing interface of the memory of FIG. 1, where the writing interface is supplied by means of a voltage regulator.

For a general description of the driving circuit 2126, reference may be made to the description of FIGS. 4 and 5.

Figure 8:
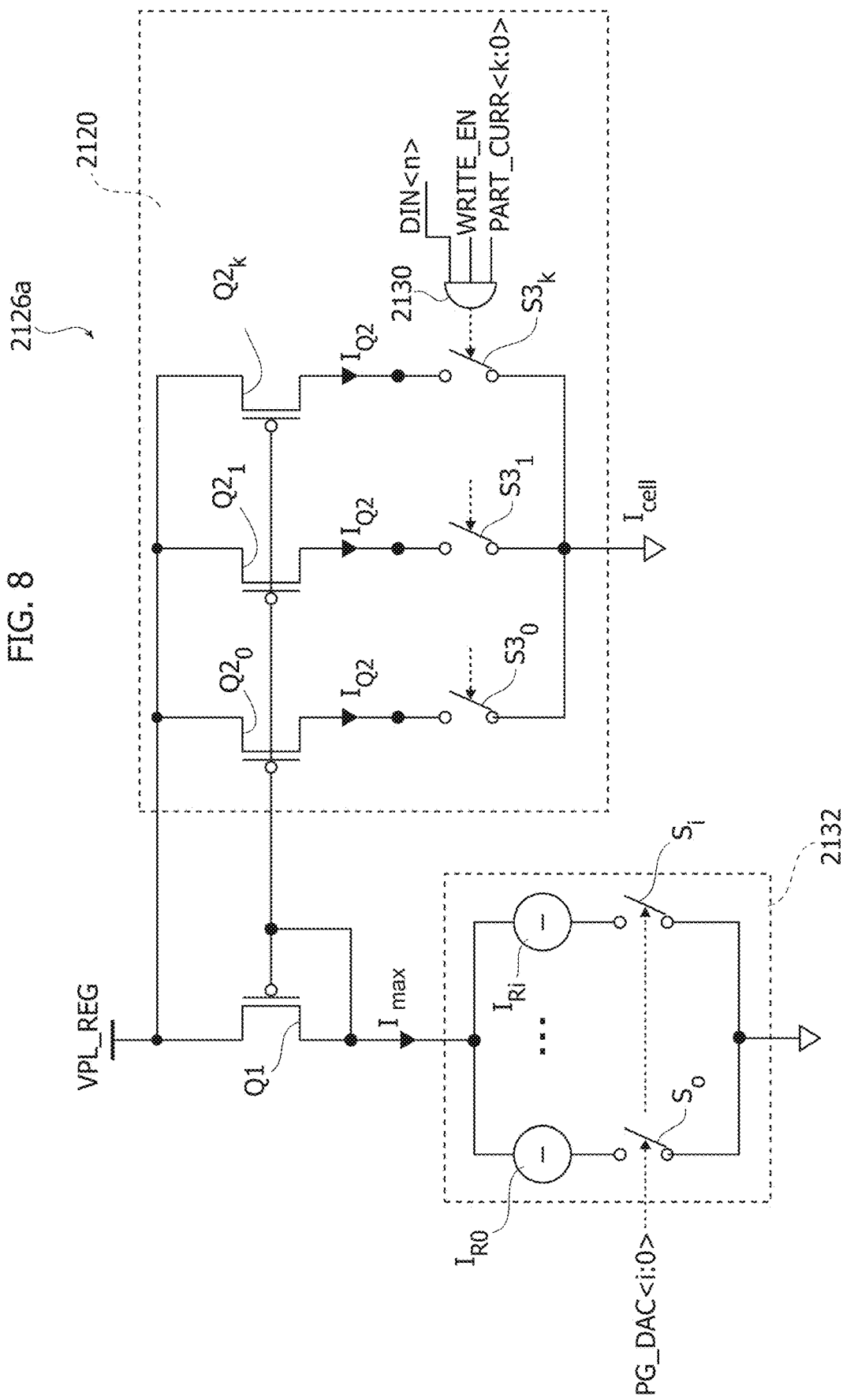
FIG. 8 shows a first embodiment of a driving circuit of the writing interface of FIG. 7.

For instance, FIG. 8 shows a possible embodiment of the driving circuit 2126a in line with what has been described with reference to FIG. 5.

In particular, in the embodiment considered, the driving circuit 2126a comprises a variable current generator 2132 configured for supplying a current $I_{max}$, where the current $I_{max}$ can be chosen (at least) between a current proportional to the current $I_{set}$ and a current proportional to the current $I_{reset}$ as a function of the signal PG_DAC<i:0>. For instance, in FIG. 7 the circuit 2128 is implemented with an IDAC having a given resolution. For instance, in the embodiment considered, the current generator 2132 comprises i+1 current generators $I_{R0}, \ldots, I_{Ri}$ that can be enabled selectively via respective switches $S_0 \ldots, S_i$ as a function of the signal PG_DAC<i:0>. Consequently, the amplitude of the current $I_{max}$ may be chosen by enabling a given number of current generators $I_{R0}, \ldots, I_{Ri}$ as a function of the signal PG_DAC<i:0>. In particular, in various embodiments, each current generator $I_{R0}, \ldots, I_{Ri}$ supplies the same current.

The current $I_{max}$ supplied by the current generator 2132 also traverses the input of a current mirror, implemented for example by means of a FET Q1 (input of the current mirror) and a plurality of FETs Q2 (outputs of the current mirror), such as p-channel FETs. Consequently, each of the transistors Q2 allows the passage of a current $I_{Q2}$ proportional to the current $I_{max}$, e.g., $I_{Q2}=I_{max}$.

In the embodiment considered, each of the transistors Q2 has, connected in series, also an electronic switch S3 that enables activation of the current supplied by means of the respective transistor Q2 as a function of the signal PART_CURR, of the signal WRITE_EN, and of the respective bit DIN<n>. In the example considered, the current $I_{cell}$ hence corresponds to the sum of the currents supplied by the transistors Q2 that are enabled through the respective switch S3.

For instance, in the example considered, the signal PART_CURR<k:0> has k+1 bits, and a corresponding number of transistors $Q2_0, \ldots, Q2_k$ are used, with respective electronic switches $S3_0, \ldots, S3_k$. For instance, in the example considered, each switch $S3_0, \ldots, S3_k$ is closed when:

a) a respective bit of the signal PART_CURR<k:0> is set at a given logic level (for example, high); and b) the signal WRITE_EN enables the circuit 2126a; and c) the respective signal DIN indicates that a programming operation (set or reset) is to be carried out.

For instance, in FIG. 8 for this purpose respective logic gates, e.g., AND gates are used. Consequently, by closing all the switches $S3_0, \ldots, S3_k$, the current $I_{cell}$ corresponds to $(k+1)I_{Q2}$. Instead, when all the switches $S3_0, \ldots, S3_k$ are open, the current $I_{cell}$ is equal to zero. Hence, the signal PART_CURR<k:0> allows a partitioning of the current supplied in k+1 steps.

Consequently, in the example considered, the variable current generator 2132 and the input of the current mirror (transistor Q1) implement the circuit 2122. Instead, the outputs of the current mirror (transistors Q2), the switches S3, and the logic gate 2130 implement the circuit 2120. Finally, the signal MAX corresponds to the current $I_{max}$.

Consequently, in the embodiment considered, the driving circuit 2126a comprises:

a first circuit configured for generating a signal MAX indicating the maximum value of the current $I_{cell}$ as a function of a first control signal PG_DAC, where the value of the control signal PG_DAC is determined on the basis of whether a set operation or a reset operation is to be carried out; and a second circuit configured for generating, in the case where the cell is to be programmed, the current $I_{cell}$ as a function of the signal MAX and a second control signal PART_CURR that makes it possible to specify the partitioning of the maximum current indicated via the signal MAX, in particular with reference to a set operation.

Figure 9A:
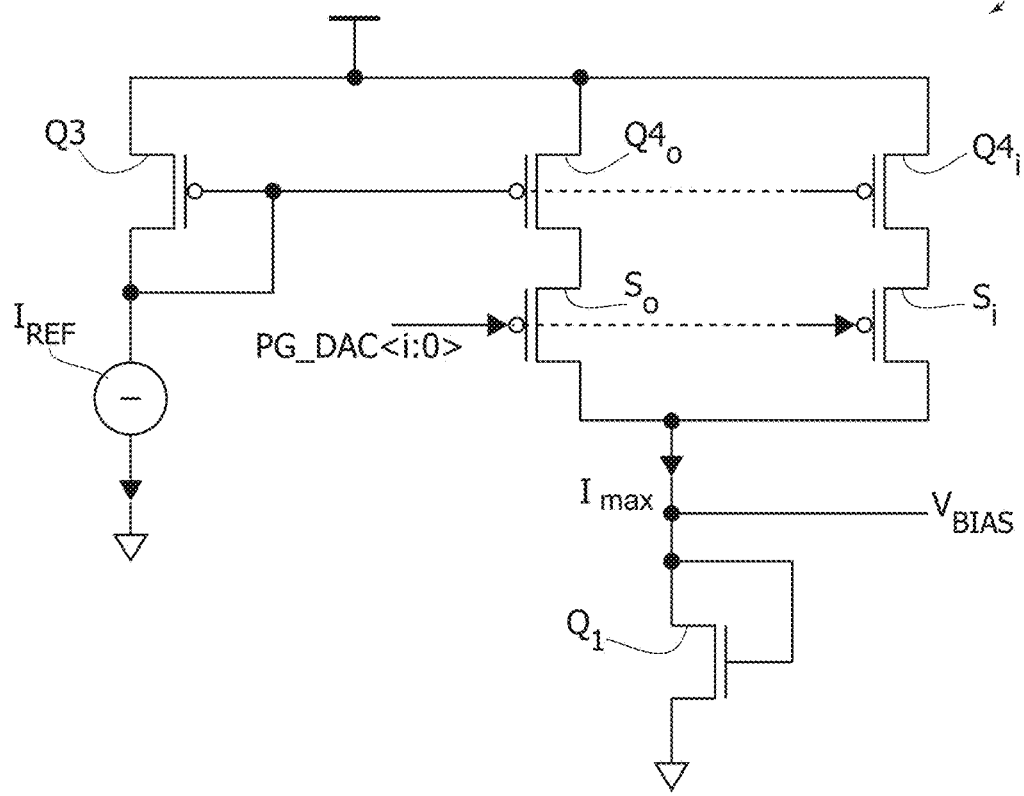
FIGS. 9A and 9B show a second embodiment of a driving circuit of the writing interface of FIG. 7.
Figure 9B:
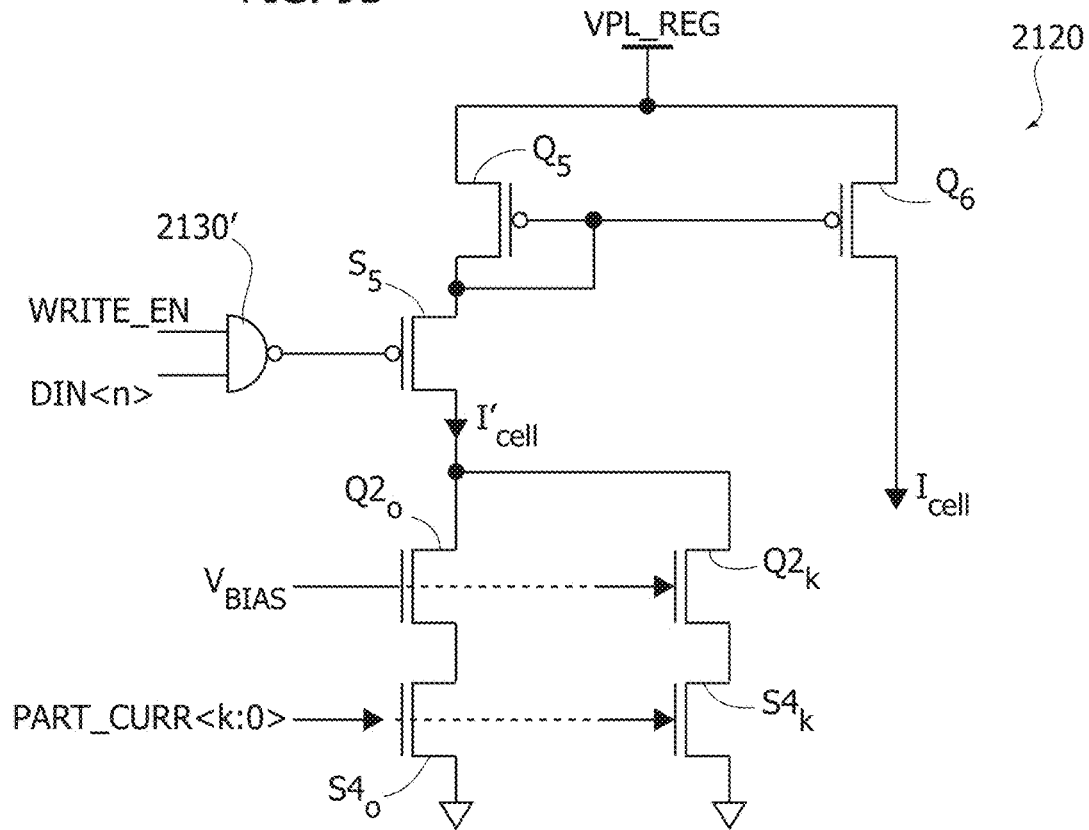

FIGS. 9A and 9B represent an alternative embodiment of the circuit 2126a.

As explained previously, the current generator 2132 may be a DAC, which comprises a plurality of current generators $I_{R0}, \ldots, I_{Ri}$ that can be enabled selectively, and where these current generators supply one and the same current.

In the embodiment considered, the above current generators $I_{R0}, \ldots, I_{Ri}$ are implemented with:

a current generator $I_{REF}$ that supplies a reference current; and a current mirror, for example implemented with p-channel FETs, which comprises an input stage/input transistor $Q_3$ and i+1 output stages/output transistors $Q4_0, \ldots, Q4_i$.

Consequently, in the embodiment, each output transistor $Q4_0, \ldots, Q4_i$ has, connected to it, a respective electronic switch $S_0, \ldots, S_i$, such as a p-channel FET, where the electronic switches $S_0, \ldots, S_i$ are driven as a function of the signal PG_DAC.

Consequently, as has been described with reference to FIG. 8, the current generator 2132 supplies a current $I_{max}$ as a function of the signal PG_DAC. This current is then applied again to a current mirror that comprises an input transistor Q1 (in the circuit 2122) and a plurality of output transistors $Q2_0, \ldots, Q2_k$ (in the circuit 2120). For instance, in the embodiment considered, a current mirror with n-channel transistors is used.

In the embodiment considered, the role of the switches S3 has been divided. In particular, the circuit 2120 comprises a respective electronic switch $S4_0, \ldots, S4_k$, such as an n-channel FET, connected in series with each output transistor $Q2_0, \ldots, Q2_k$, where the electronic switches $S4_0, \ldots, S4_k$ are driven as a function of the signal PART_CURR, so that they supply a current $I'_{cell}$ partitioned as a function of the signal PART_CURR. Moreover, the circuit 2120 comprises an electronic switch S5, such as a p-channel FET, which makes it possible to enable the current $T_{cell}$. In the embodiment considered, the switch S5 is hence driven as a function of the signals WRITE_EN and DIN<n>, for example by means of the output of an NAND gate 2130' that receives the aforementioned signals at input.

In the embodiment considered, the current $I'_{cell}$ is not supplied directly to the cell, but a further current mirror is used comprising an input transistor Q5 and an output transistor Q6, where the input transistor Q5 receives the current $I'_{cell}$ and the output transistor Q6 supplies the current $I_{cell}$. For instance, in the embodiment considered, a current mirror with p-channel transistors is used, where the source terminal of these transistors is connected to the voltage VPL_REG.

As shown in FIG. 7, the control circuit 2124a does not generate only the control signals PG_DAC, PART_CURR, DIN, and WRITE_EN for the driving circuit 2126a, but also a further control signal OUT_STAGE for the voltage regulator 2128a.

FIG. 9 shows an embodiment of a voltage regulator 2128a according to the present disclosure.

Figure 6A:
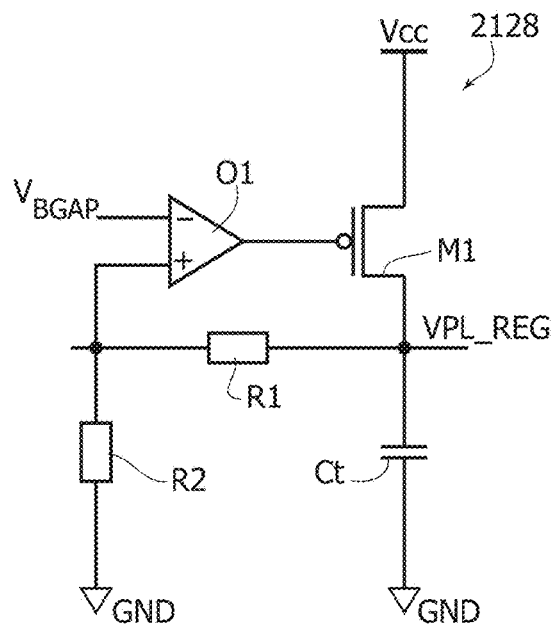
FIGS. 6A and 6B show examples of voltage regulators.
Figure 6B:
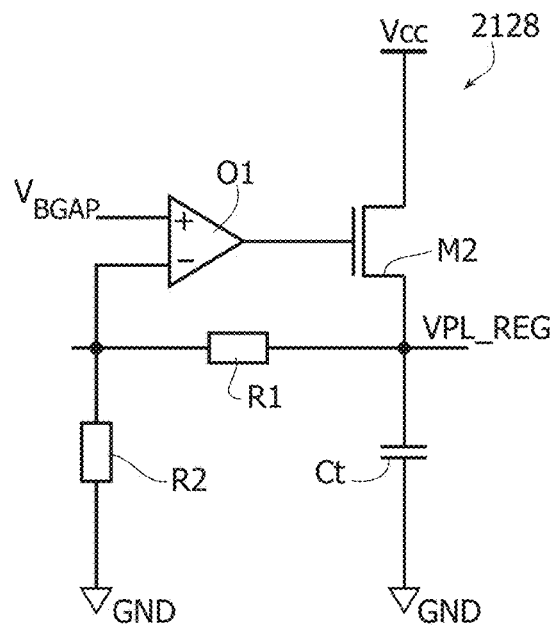

In particular, in a way similar to what has been described with reference to FIGS. 6A and 6B, the circuit 2128a comprises:

a capacitor Ctank, where the voltage across the capacitor Ctank corresponds to the voltage VPL_REG;

a FET NB connected between the supply voltage Vcc and the capacitor Ctank, where the transistor NB represents a voltage generator in the source-follower configuration; and a regulation circuit that drives the gate terminal of the transistor NB for regulating the voltage VPL_REG on a required value.

Consequently, in general the voltage regulator 2128a comprises a positive input terminal 30a and a negative input terminal 30b (which typically represents a ground gnd) for receiving an input voltage Vcc. For instance, the aforementioned terminals 30a and 30b can be connected to respective pads or pins of an integrated circuit that comprises the memory 20. Moreover, the voltage regulator 2128a comprises a positive output terminal 32a and a negative output terminal 32b for supplying an output voltage VPL_REG, where the negative output terminal 32b is connected (for example, directly) to the negative input terminal 30b, e.g., to ground gnd.

In the embodiment considered, the capacitor Ctank is hence connected (for example, directly) between the terminals 32a and 32b. Moreover, the terminal 32a is connected, through the transistor NB, to the terminal 30a, i.e., to the voltage Vcc.

As explained previously, the voltage regulator 2128a should have a high speed of response as a function of the current $I_{cell}$. In this context, the inventor has noted that the response of the voltage regulator 2128a can be improved when the transistor NB supplies a current comparable to the current absorbed by the driving circuit 2126a.

In particular, for a signal DATA_IN<h:0> having (h+1) bits (and hence also for a corresponding signal DIN<h:0>) the current absorbed depends upon the number of bits y (0≤y≤h+1) that are effectively to be written (for example, the number of bits of the signal DIN<h:0> that are set to "1"), i.e., the writing parallelism. For instance, assuming having to write y=5 bits:

in the case of a set operation, the current required during the interval ΔT2 corresponds to $I_{max,h}$=5 $I_{set}$; and in the case of a reset operation, the current required during the interval ΔT1 corresponds to $I_{max,h}$=5 $I_{reset}$.

Instead, considering a partitioning into 16 levels, the aforementioned current is then reduced progressively during the interval ΔT3, for example $^{15}/_{16}$ $I_{max,h}$, $^{14}/_{16}$ $I_{max,h}$, . . . , $^{1}/_{16}$ $I_{max,h}$, 0.

Consequently, in the embodiment considered, not just one transistor NB is used, but (m+1) transistors NB, referred to hereinafter as transistors NB<m:0>. In particular, each transistor NB of the transistors NB<m:0> is connected (for example, directly) to a respective switch PB, the ensemble of the switches being referred to hereinafter as switches PB<m:0>, between the terminals 30a and 32a. Consequently, each switch PB enables selective activation of the flow of current through the respective FET NB. For instance, in the embodiment considered, also the switches PB are FETs. For example, in various embodiments, the switches PB are p-channel FETs, e.g., PMOSs, and the transistors NB are n-channel FETs, e.g., NMOSs. In this case, a source terminal of each transistor PB can be connected (for example, directly) to the terminal 30a, a drain terminal of each transistor PB can be connected (for example, directly) to a drain terminal of a respective transistor NB, and a source terminal of the respective transistor NB can be connected (for example, directly) to the terminal 32a.

In particular, in the embodiment considered, each of the switches PB (for example, the respective gate terminals) are driven by means of the signal OUT_STAGE, which hence has a corresponding number of bits denoted hereinafter by OUT_STAGE<m:0>. Consequently, the signal OUT_STAGE enables selective activation of the flow of current through the transistors NB<m:0>. Hence, the control circuit 2124a can configure, through the signals OUT_STAGE<m:0>, the characteristic of current supply.

In particular, the inventors have noted that the main variation of the current required is due to the variation of the number of cells to be programmed. In fact, typically, the number of driving circuits corresponds to the number of bits (h+1) of the signal DIN/DATA_IN. Consequently, the current required at the start of the interval ΔT1 ranges from 0 to $I_{max,h}$=$I_{reset}$·y, and at the start of the interval ΔT2 ranges from 0 to $I_{max,h}$=$I_{set}$·y, where y corresponds to the number of bits of the signal DIN that are to be written. Consequently, in various embodiments, the number of branches (m+1)

corresponds to the number of bits (h+1) of the signal DIN. For instance, considering a 32-bit data signal DIN, the regulator 2128a may comprise 32 branches. Consequently, the number of branches (m+1) depends upon a coefficient x and the number of bits (h+1) of the signal DIN, i.e., (m+1)=x·(h+1). For instance, in this case, the number of branches to be activated may correspond to x·y.

Instead, to take into account also partitioning of the current (PART_CURR<k:0>) during the interval ΔT3 of a set operation, the number of branches activated should be reduced progressively during the interval ΔT3. For instance, assuming a partitioning of the current into (k+1)=16 levels (from 15 to 0), and a number of bits y that are to be written equal to 32, the control circuit 2124a can set the signal OUT_STAGE in such a way as to activate 32 branches during the interval ΔT₂ (with x=1), and then reduce the number of branches activated progressively from 30 to 0, for example 30, 28, 26, . . . , 2, 0; i.e., the number of branches activated is reduced with a step that corresponds to (x·y)/(k+1).

Figure 10:
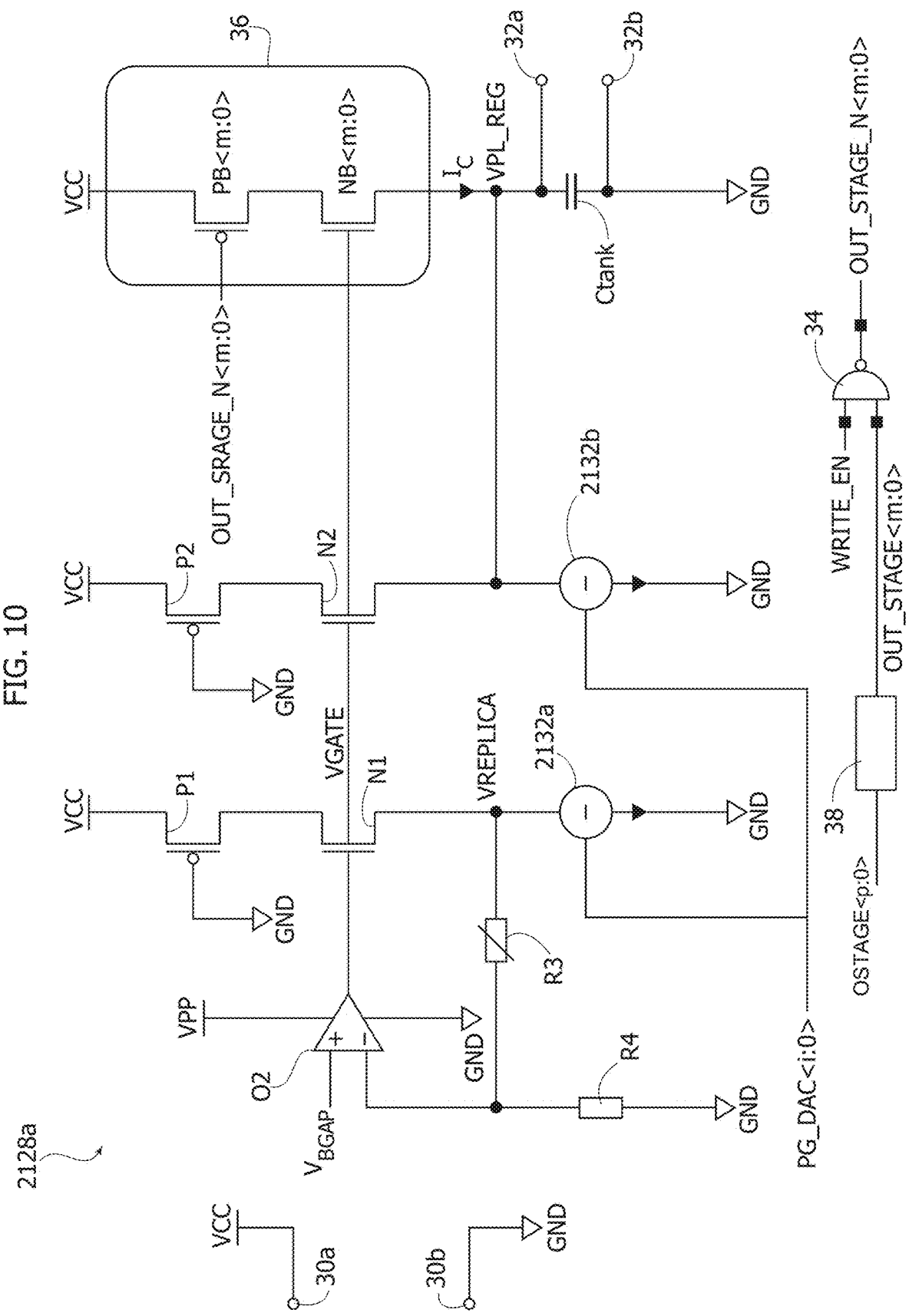
FIG. 10 shows an embodiment of a voltage regulator of the writing interface of FIG. 7.
Figure 11:
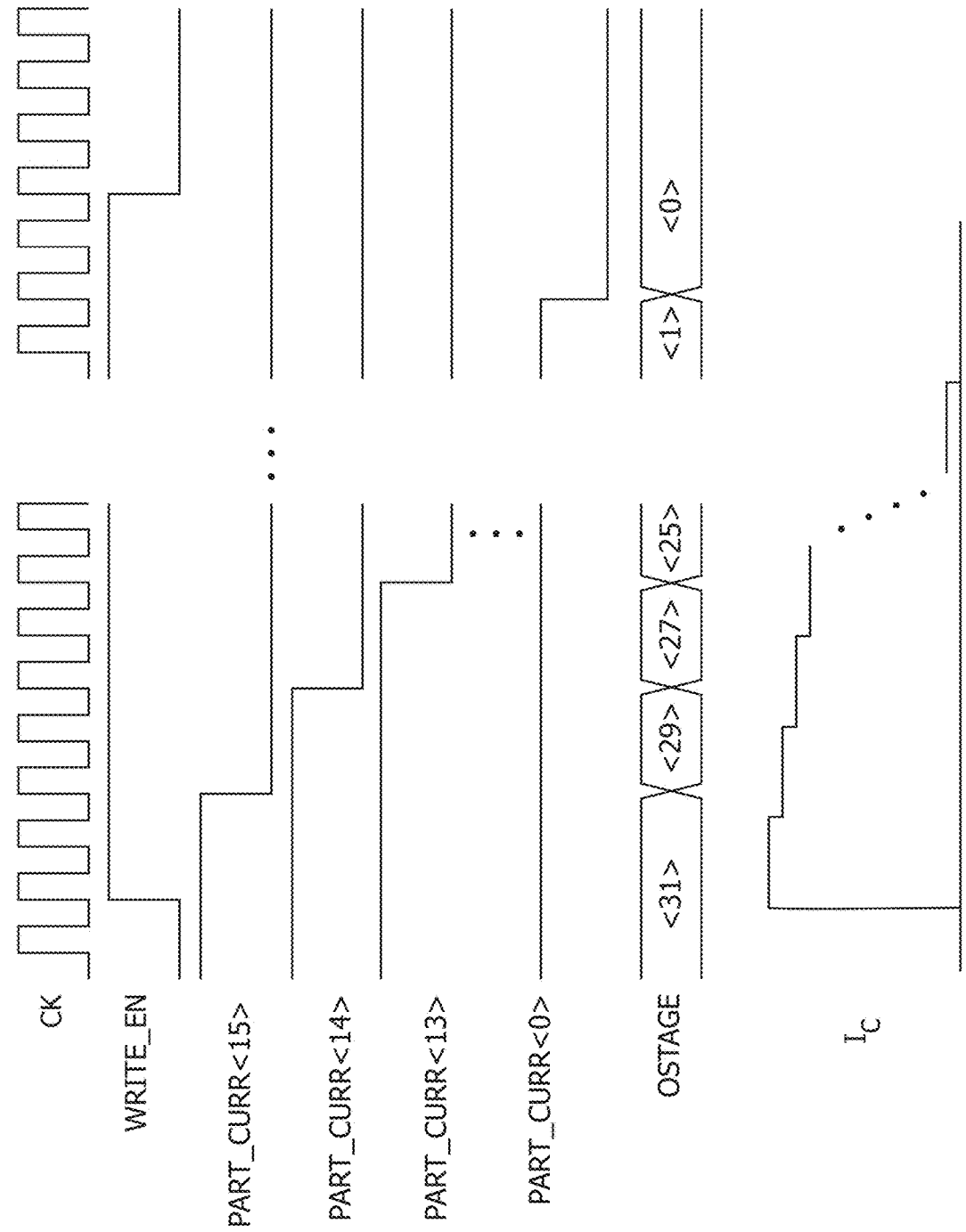
FIG. 11 shows signals that exemplify operation of the writing interface of FIG. 7.

For instance, in various embodiments, the control circuit 2124a does not supply the signal OUT_STAGE<m:0> directly, but a signal OSTAGE<p:0> having (p+1) bits, with (m+1)=2^(p+1). In particular, the value of this signal OSTAGE<p:0> may directly indicate the number of branches to be activated. For instance, in FIG. 10 a decoder circuit 38 is illustrated, which receives at input the signal OSTAGE and supplies at output the signal OUT_STAGE in such a way that the number of branches to be activated corresponds to the value encoded with the signal OSTAGE. For instance, this is schematically represented in FIG. 10, where the output stage 36 comprises 32 branches and the value of the signal OSTAGE corresponds to 31 and then decreases progressively as follows: 29, 27, 25, . . . , 1, 0. In particular, in this case, the number of branches to be activated may correspond to OSTAGE+1, for example 32 branches for a value of OSTAGE of 31. In this case, one of the branches of the output stage 36 is hence always activated when the signal WRITE_EN enables the output stage 36.

Consequently, in general the control circuit 2124a generates the signal OUT_STAGE (or OSTAGE) in such a way as to activate a given number of branches that (apart from the scaling factor x) depends upon the number of bits of the data signal DIN that are to be written (y) and, in the case of a set operation, upon the partitioning of the current (k+1 levels).

Hence, when the scaling factor x is low, the reduction may not correspond to an integer, and consequently compensation is not optimal. However, as will be described in greater detail hereinafter, the aforementioned difference may in any case be compensated since the transistors NB work as source followers, and hence cause more or less current to pass according to the difference in voltage between the gate terminal and the source terminal.

In general, the relation between the number of branches to be activated and the subsequent partitioning can also be stored in a look-up table.

Instead, to take into account also the maximum current absorbed by the individual cell ($I_{set}$ or $I_{reset}$ as indicated by the signal PG_DAC<i:0>), the regulation circuit should apply to the gate terminal of each transistor NB<m:0> a voltage so that each transistor NB lets through a current $I_C$ that should be substantially proportional to $I_{set}$ or $I_{reset}$, i.e., $I_C=I_{set}/x$ or $I_C=I_{reset}/x$. For instance, considering the case where the number of branches (m+1) corresponds to the number of the bits (h+1) of the signal DATA_IN, each branch should supply substantially a current $I_C=I_{set}$ or $I_C=I_{reset}$ chosen as a function of the signal PG_DAC<i:0>.

Basically, in the embodiment considered, the regulation circuit comprises a first branch, which includes a transistor N1 (having the same type of channel as the transistors NB) and a current generator 2132a that are connected in series between the terminals 30a and 30b. In various embodiments, also a transistor P1 (having the same type of channel as the transistors PB) may be connected in series to the transistor N1 for compensating for the presence of the transistor PB. In general, the gate terminal of the transistor P1 may be connected to a voltage that enables closing of the transistor P1, for example on the terminal 30b when a p-channel FET is used.

For instance, in the embodiment considered, the transistor P1 is a p-channel FET and the transistor N1 is a p-channel FET. In this case, a source terminal of the transistor P1 may be connected (for example, directly) to the terminal 30a, a drain terminal of the transistor P1 may be connected (for example, directly) to a drain terminal of the transistor N1, and a source terminal of the transistor N1 may be connected (for example, directly) through the current generator 2132a to the terminal 30b.

In the embodiment considered, the voltage VREPLICA on the intermediate point between the transistor N1 and the current generator 2132a is supplied through a voltage divider to a first input terminal of the operational amplifier O2. In particular, in the embodiment considered, the voltage divider comprises two resistors R3 and R4 that are connected between the intermediate point between the transistor N1 and the current generator 2132a and the terminal 30b. Consequently, the voltage divider supplies a voltage proportional to the voltage VREPLICA. A second input terminal of the operational amplifier O2 is connected to a reference voltage $V_{BGAP}$, and the output of the operational amplifier O2 drives the gate terminal of the transistor N1. Consequently, the operational amplifier O2 varies the voltage on the gate terminal of the transistor N1 in such a way that the voltage on the source terminal of the transistor N1 corresponds to VREPLICA=$V_{BGAP}$·(1+R3/R4).

For instance, when the transistor N1 (and likewise the transistor NB) is an n-channel FET, the voltage divider R3/R4 may be connected to the negative input terminal of the operational amplifier O2, and the voltage $V_{BGAP}$ may be connected to the positive input terminal. Instead, when the transistor N1 (and likewise the transistor NB) is a p-channel FET, the voltage divider R3/R4 may be connected to the positive input terminal of the operational amplifier O2, and the voltage $V_{BGAP}$ may be connected to the negative input terminal. Preferably, the voltage $V_{BGAP}$ is a reference voltage that is very stable and practically insensitive to the process spread and to variations of supply and temperature.

In the embodiment considered, the regulation circuit comprises a second branch that corresponds to the first branch; i.e., the second branch comprises a transistor N2 (which has the same type of channel as the transistor N1) and a current generator 2132b that are connected in series between the terminals 30a and 30b. In various embodiments, also a transistor P2 (which has the same type of channel as the transistor P1) may be connected in series to the transistor N2 to compensate for the presence of the transistor PB. In general, the gate terminal of the transistor P2 may be connected to the same voltage as that to which the gate terminal of the transistor P1 is connected, for example to the terminal 30b.

Basically, also the transistor N2 is configured as source follower and regulates the voltage VPL_REG when none of the branches of the stage 36 is activated.

In the embodiment considered, the gate terminals of the transistor N2 and of the transistors NB are connected (for example, directly) to the gate terminal of the transistor N1; i.e., they are thus driven by the same voltage. In addition, the terminal 32a is connected to the intermediate point between the transistor N2 and the current generator 2132b.

In particular, in the embodiment considered, the generators 2132a and 2132b are configured for supplying the same current, where the current supplied may be chosen so as to be proportional to the current $I_{set}$ or $I_{reset}$ as a function of the signal PG_DAC. For this purpose, the current generators may basically correspond to the generator 2132 described with reference to FIG. 8.

Consequently, in the embodiment considered, the transistors N1, N2, and NB are configured as source followers, and the regulation is based upon a feedback not of the output voltage VPL_REG but of its replica VREPLICA, with benefits in terms of frequency stability and speed of response. The circuit is substantially based upon the concept of "replica", where the matching between the transistors N1 and N2, which are source followers traversed by the same current (with the transistors PD disabled), makes it possible to follow the process spread and temperature variations, maintaining the output voltage VPL_REG at the desired value.

Consequently, in various embodiments, the phase-change memory comprises an array 200 of phase-change memory cells CELL, where a memory cell CELL can be brought from an amorphous state with low electrical conductivity into a polycrystalline state with high conductivity by applying a set current $I_{set}$ for a given time interval $\Delta T2$. The address decoders 202 and 204 enable selection of a sub-area in the array 200, where the sub-area selected has the same number of bits as the data signal DATA_IN.

In various embodiments, the control circuit 2124a determines, for each memory cell in the selected sub-area, whether a respective bit of the data signal DATA_IN indicates that the memory cell is to be brought from the amorphous state with low electrical conductivity to the polycrystalline state with high conductivity, or vice versa. Instead, the driving circuit or circuits 2126a apply to the aforementioned memory cells the set current $I_{set}$. Consequently, the current absorbed by the driving circuit or circuits 2126a changes on the basis of the number of memory cells that are to be programmed.

In various embodiments, the driving circuit or circuits 2126a is/are supplied via the regulated voltage VPL_REG, which is supplied via the voltage regulator 2128a.

In particular, in various embodiments, the aforementioned voltage regulator 2128a comprises a positive input terminal 30a and a negative input terminal 30b for receiving a supply voltage Vcc, and a positive output terminal 32a and a negative output terminal 32b for supplying the regulated voltage VPL_REG. In particular, as shown in FIG. 9, the aforementioned voltage regulator 2128a comprises a capacitor Ctank connected between the positive output terminal 32a and the negative output terminal 32b.

In various embodiments, the output stage 36 of the voltage regulator 2128a comprises a plurality of branches. In general, each branch comprises a voltage generator connected between the positive input terminal 30a. In particular, each voltage generator is configured for generating (for example, by means of a respective transistor NB) a current $I_C$ that is variable as a function of a driving signal and the voltage VPL_REG (in particular, the difference between the voltage of the driving signal and the voltage VPL_REG). In addition, each voltage generator can be selectively activated (for example, via a respective electronic switch PB) as a function of a respective signal OUT_STAGE, which basically represents an enabling signal.

Finally, the regulation circuit of the voltage regulator 2128a generates the driving signals for the variable current generators (e.g., for the gate terminals of the transistors NB) in such a way as to regulate (e.g., directly following the schemes shown in FIG. 6A or 6B, for example replacing the transistors M1 or M2 with the output stage 36, or indirectly as illustrated in FIG. 9) the voltage VPL_REG between the output terminals on a required value.

In this context, in various embodiments, the control circuit 2124a can thus determine the number of memory cells that are to be programmed/set and generates the enabling signals OUT_STAGE as a function of the aforementioned number.

In particular, in the embodiment illustrated in FIG. 9, the output stage 36 comprises a certain number (m+1) of branches identical to the branches constituting the series of transistors P2-N2 and P1-N1, which can be activated by means of the configuration signals OUT_STAGE. Once the number (y) of cells to be programmed is determined, the control circuit 2124a can thus determine the number of branches of the output stage 36 to be activated (x·y), such that, during the writing operation, the output voltage VPL_REG is kept exactly equal to the desired voltage VREPLICA.

The stability of the output voltage VPL_REG is maintained also in the transients during which the current absorbed by the load can pass very rapidly from zero to the steady-state value. For instance, for this purpose, the signal OUT_STAGE cannot be applied directly to the switches PB, but the switches PB can be driven by means of a logic gate 34, such as an AND gate, which receives at input the signal OUT_STAGE and the signal WRITE_EN. Consequently, in this way, the output stage 36 is only activated when the driving circuits 2126a absorb current. This synchronisation enables reduction of the risk of there arising at output oscillations typical of closed-loop regulators according to the prior art, in the presence of fast variations of the load current.

In practice, the inevitable temporal offsets may in any case generate small variations of the output voltage, the amount of which can be reduced with the use of filtering capacitances on the output of the regulator.

As explained previously, by choosing an appropriate number of branches for the stage 36, the compensation may be substantially perfect when a reset of the memory cells is carried out. Instead, in the case of a set pulse, where the current of the cell is partialised according to a staircase pattern, the control circuit 2124a can in any case implement a continuous adaptation of the driving capability of the output stage 36 to the current effectively required by the load, i.e., the driving circuits 2126a. As mentioned previously, the control circuit 2124a can use for this purpose a look-up table from which to retrieve the configurations of the bits of the signal OUT_STAGE to be supplied to the output stage 36 with an appropriate timing synchronised with the signals PART_CURR<k:0>.

Figure 12:
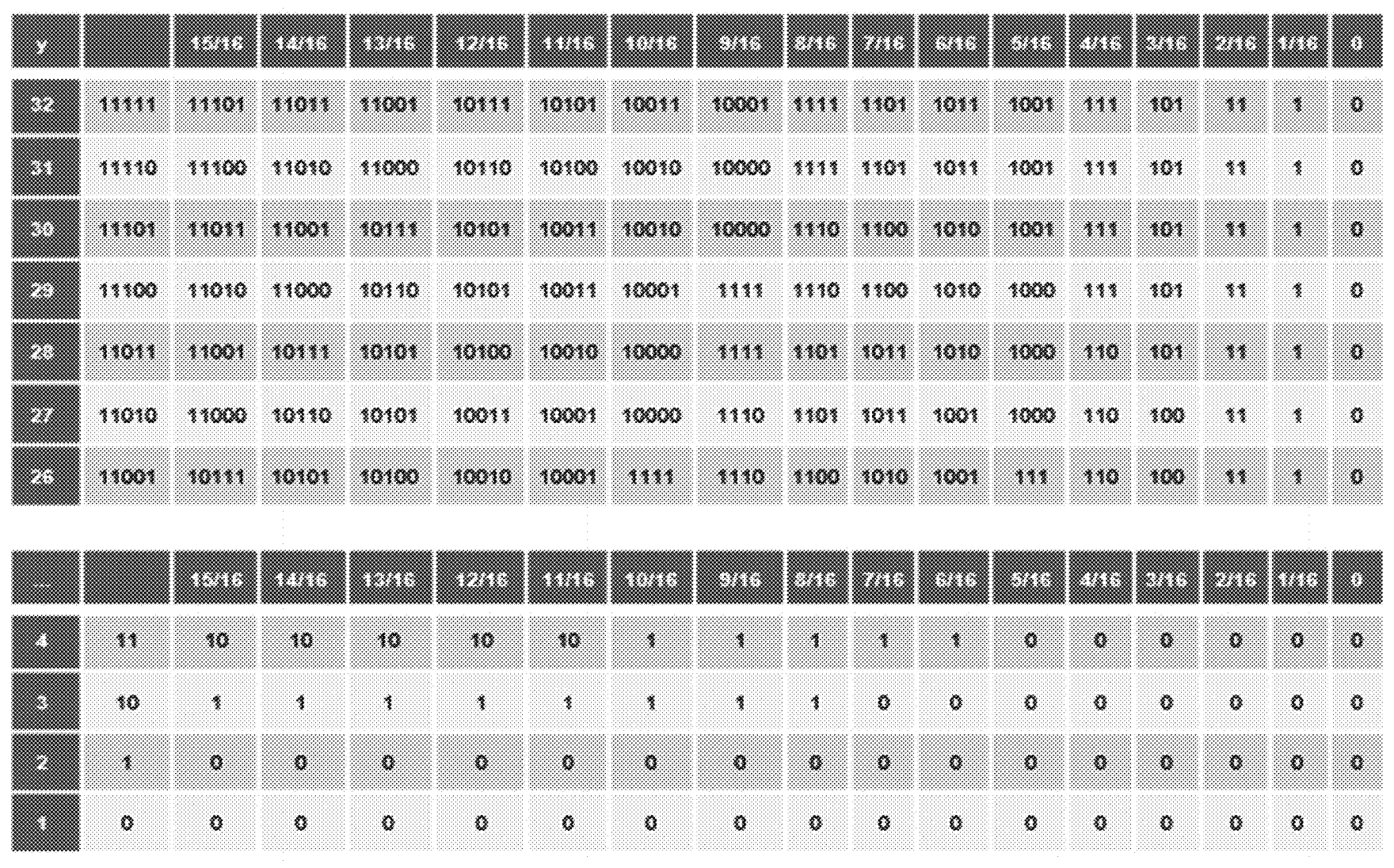

Consequently, as shown in FIG. 12 for the exemplary case of thirty-two branches for the output stage 36, where the signal OSTAGE is chosen between 0 and 31 (i.e., a branch is already enabled when the signal WRITE_EN is set), such a look-up table typically has a number of rows equal to the maximum number of y, and a number of columns equal to the number of steps (k+1), i.e., in the embodiment considered, equal to the number of elements that constitute the signal vector PART_CURR<k:0>. For instance, illustrated in FIG. 12 is the corresponding binary value for the signal OSTAGE.

Figure 13:
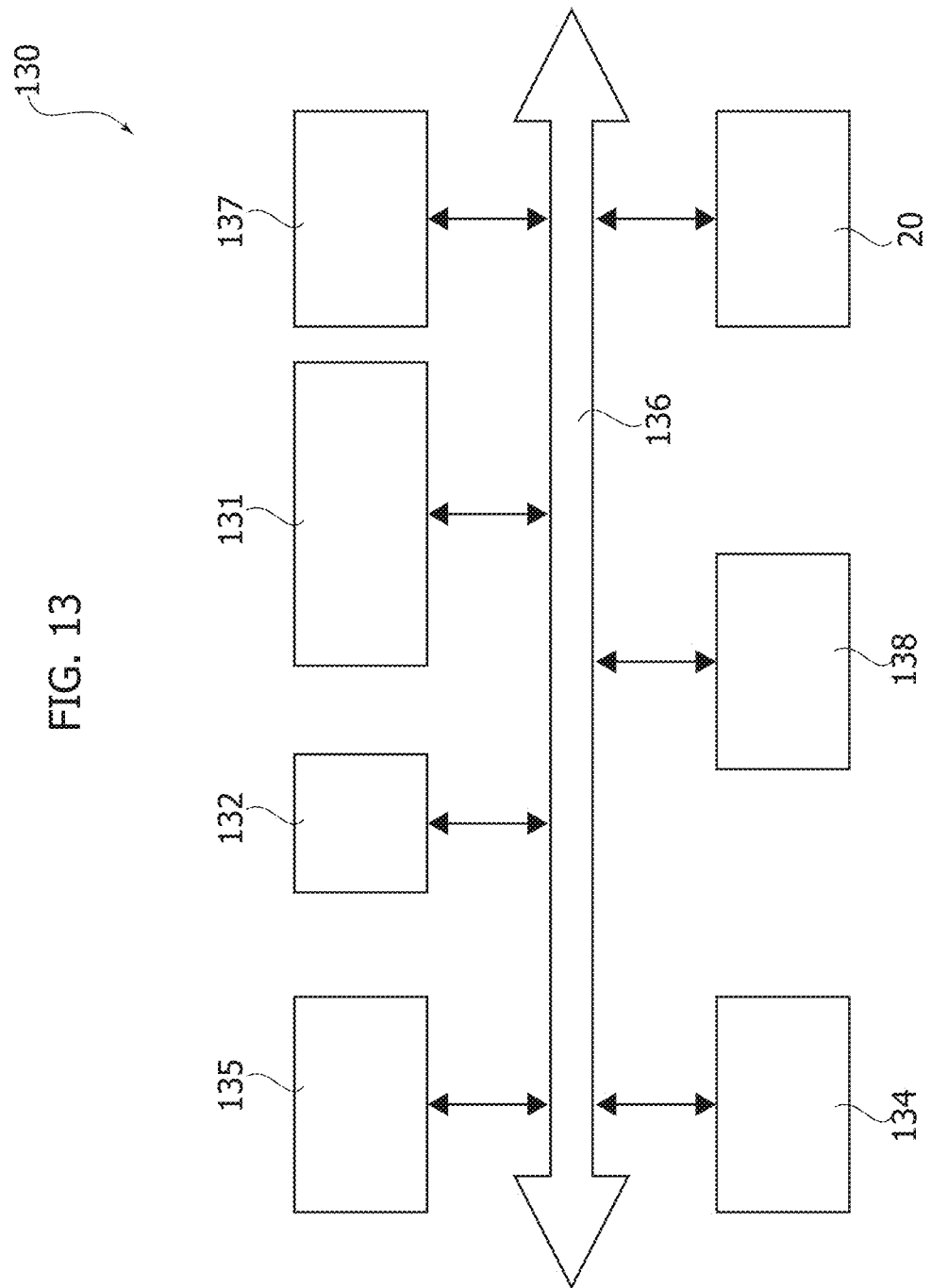
FIG. 13 shows an embodiment of a system that comprises a memory according to the present disclosure.

FIG. 13 shows a part of an electronic system 130 according to the present disclosure. The electronic system 130 can be used in electronic devices, such as: a PDA (Personal Digital Assistant); a portable or fixed computer, possibly with wireless data-transfer capacity; a mobile phone; a digital audio player; a photographic camera or video camera; or other devices that are able to process, store, transmit, and receive information.

In particular, the electronic system 130 comprises the (nonvolatile) memory 20 with phase-change memory cells described previously and a processing unit 131 (for example, equipped with microprocessor, DSP, or microcontroller), which are both coupled to a bus 136 designed for exchanging data with the memory 20. Consequently, the processing unit 131 can generate the signals ADR and DATA_IN described previously.

Moreover, the electronic system 130 may optionally comprise, coupled to the bus 136, one or more of the following elements:

an input/output device 132 (for example, equipped with keypad and display) for input and display of the data;

a wireless interface 134, for example an antenna, for transmitting and receiving data through a radiofrequency wireless-communication network;

a RAM 135;

a battery 137, which can be used as electrical supply source in the electronic system 130; i.e., the battery 137 can supply the supply voltage Vcc; and a photographic camera and/or a video camera 138.

In various embodiments, the processing unit 131 may be connected to the memory 20 through a dedicated connection different from, and possibly additional to, the bus 136 (the latter may hence be present or absent).

Of course, without prejudice to the principle of the invention, the details of construction and the embodiments may vary widely with respect to what has been described and illustrated herein purely by way of example, without thereby departing from the scope of the present invention, as defined by the ensuing claims.

What is claimed is:

1. A phase-change memory comprising:
an array of a plurality of phase-change memory cells, wherein a memory cell is changeable from an amorphous state with low electrical conductivity into a polycrystalline state with high conductivity by applying a set current for a first interval;
an address decoder configured for receiving an address signal and selecting a sub-area in the array of the plurality of memory cells, the selected sub-area having a given number of bits of a data signal; and
a writing circuit comprising:
a control circuit configured for receiving the data signal and determining, for each memory cell in the selected sub-area, whether a respective bit of the data signal indicates that the memory cell is to be changed from the amorphous state to the polycrystalline state;
one or more driving circuits supplied via a regulated voltage and configured for applying the set current for the first interval to the memory cells that are to be changed from the amorphous state to the polycrystalline state; and
a voltage regulator comprising:
a positive input terminal and a negative input terminal for receiving a supply voltage, and a positive output terminal and a negative output terminal for supplying the regulated voltage to the one or more driving circuits;
a capacitor connected between the positive output terminal and the negative output terminal;
an output stage comprising a plurality of branches, where each branch comprises a voltage generator connected between the positive input terminal and the positive output terminal, wherein each voltage generator is configured for generating a variable current as a function of a driving signal and of the regulated voltage, and wherein each voltage generator is selectively activated as a function of a respective enabling signal; and
a regulation circuit configured for generating driving signals for the voltage generators in such a way as to regulate the voltage between the positive output terminal and the negative output terminal on a required value,
wherein the control circuit is configured for:
determining the number of the memory cells that are to be changed from the amorphous state to the polycrystalline state; and
generating the enabling signals as a function of the number of the memory cells that are to be changed from the amorphous state to the polycrystalline state.

2. The phase-change memory according to claim 1, wherein the number of branches of the output stage corresponds to a predetermined coefficient multiplied by a predetermined number of bits of the data signal.

3. The phase-change memory according to claim 2, wherein the predetermined coefficient is equal to unity.

4. The phase-change memory according to claim 2, wherein the one or more driving circuits is configured for applying a current to the memory cells that are to be changed from the amorphous state to the polycrystalline state, the current being decreased from the set current to zero as a function of a partitioning signal for a second interval.

5. The phase-change memory according to claim 4, wherein generating the enabling signals as the function of the number of the memory cells that are to be changed from the amorphous state to the polycrystalline state comprises generating the enabling signals in such a way that a variable second number of the voltage generators is activated during the second interval, the variable second number being determined as a function of the first number and the partitioning signal.

6. The phase-change memory according to claim 1, wherein generating the enabling signals as the function of the number of the memory cells that are to be changed from the amorphous state to the polycrystalline state comprises generating the enabling signals in such a way that a first number of the voltage generators is activated during the first interval, and wherein the first number corresponds to a predetermined coefficient multiplied by the number of the memory cells that are to be changed from the amorphous state to the polycrystalline state.

7. The phase-change memory according to claim 6, wherein the predetermined coefficient is equal to unity.

8. The phase-change memory according to claim 6, wherein the one or more driving circuits is configured for applying a current to the memory cells that are to be changed from the amorphous state to the polycrystalline state, the current being decreased from the set current to zero as a function of a partitioning signal for a second interval.

9. The phase-change memory according to claim 8, wherein generating the enabling signals as the function of the number of the memory cells that are to be changed from the amorphous state to the polycrystalline state comprises generating the enabling signals in such a way that a variable second number of the voltage generators is activated during the second interval, the variable second number being determined as a function of the first number and the partitioning signal.

10. The phase-change memory according to claim 1, wherein each voltage generator comprises a first field-effect transistor and an electronic switch connected in series between the positive input terminal and the positive output terminal, wherein a gate terminal of the first field-effect transistor is driven via a respective driving signal, and wherein the electronic switch is driven via a respective enabling signal.

11. The phase-change memory according to claim 10, further comprising:
a second field-effect transistor and a first current generator connected in series between the positive input terminal and the negative input terminal, wherein the second field-effect transistor has the same type of channel as the first field-effect transistor;
a voltage divider configured for supplying a voltage proportional to the voltage on the first current generator; and
an operational amplifier comprising a first input terminal, a second input terminal, and an output terminal, wherein the first input terminal is connected to a reference voltage, the second input terminal is connected to the voltage proportional to the voltage on the first current generator, and the output terminal is connected to the gate terminals of the first field-effect transistors and to a gate terminal of the second field-effect transistor.

12. The phase-change memory according to claim 11, further comprising a third field-effect transistor and a second current generator connected in series between the positive input terminal and the negative input terminal, wherein the third field-effect transistor has the same type of channel as the first field-effect transistor, wherein the second current generator is configured for supplying a current that corresponds to the current supplied by the first current generator, wherein the output terminal of the operational amplifier is connected to a gate terminal of the third field-effect transistor, and wherein an intermediate point between the third field-effect transistor and the second current generator is connected to the positive output terminal.

13. The phase-change memory according to claim 11, wherein the first current generator is configured for supplying a current proportional to the set current as a function of a selection signal.

14. The phase-change memory according to claim 1, wherein the memory cells are changeable from the polycrystalline state to the amorphous state by applying a reset current for a third interval, and
wherein the one or more driving circuits is configured for applying the reset current for the third interval to the memory cells in the selected sub-area.

15. The phase-change memory according to claim 14, wherein a first current generator is configured for supplying a current proportional to the reset current as a function of a selection signal.

16. An electronic system comprising:
a processing unit; and
the phase-change memory according to claim 1.

17. A voltage regulator comprising:
a positive input terminal and a negative input terminal for receiving a supply voltage, and a positive output terminal and a negative output terminal for supplying a regulated voltage to one or more driving circuits;
a capacitor connected between the positive output terminal and the negative output terminal;
an output stage comprising a plurality of branches, where each branch comprises a voltage generator connected between the positive input terminal and the positive output terminal, wherein each voltage generator is configured for generating a variable current as a function of a driving signal and of the regulated voltage, and wherein each voltage generator is selectively activated as a function of a respective enabling signal; and
a regulation circuit configured for generating driving signals for the voltage generators in such a way as to regulate a voltage between the positive output terminal and the negative output terminal on a required value.

18. The voltage regulator according to claim 17, wherein each voltage generator comprises a first field-effect transistor and an electronic switch connected in series between the positive input terminal and the positive output terminal, wherein a gate terminal of the first field-effect transistor is driven via a respective driving signal, and wherein the electronic switch is driven via a respective enabling signal.

19. The voltage regulator according to claim 18, further comprising:
a second field-effect transistor and a first current generator connected in series between the positive input terminal and the negative input terminal, wherein the second field-effect transistor has the same type of channel as the first field-effect transistor;
a voltage divider configured for supplying a voltage proportional to the voltage on the first current generator; and
an operational amplifier comprising a first input terminal, a second input terminal, and an output terminal, wherein the first input terminal is connected to a reference voltage, the second input terminal is connected to the voltage proportional to the voltage on the first current generator, and the output terminal is connected to the gate terminals of the first field-effect transistors and to a gate terminal of the second field-effect transistor.

* * * * *